United States Patent
Droopad et al.

(10) Patent No.: US 7,442,654 B2
(45) Date of Patent: *Oct. 28, 2008

(54) METHOD OF FORMING AN OXIDE LAYER ON A COMPOUND SEMICONDUCTOR STRUCTURE

(75) Inventors: Ravindranath Droopad, Chandler, AZ (US); Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 393 days.

This patent is subject to a terminal disclaimer.

(21) Appl. No.: 11/239,749

(22) Filed: Sep. 30, 2005

(65) Prior Publication Data

US 2006/0030098 A1   Feb. 9, 2006

Related U.S. Application Data

(63) Continuation-in-part of application No. 11/136,845, filed on May 25, 2005, now Pat. No. 7,276,456, which is a continuation of application No. 10/879,440, filed on Jun. 29, 2004, now Pat. No. 6,914,012, which is a continuation of application No. 10/051,494, filed on Jan. 18, 2002, now Pat. No. 6,756,320.

(51) Int. Cl.
*H01L 21/31* (2006.01)

(52) U.S. Cl. .............. 438/763; 438/722; 257/E21.274; 257/E21.286

(58) Field of Classification Search ......... 438/761–763, 438/770–773, 788; 257/E21.274, E21.286
See application file for complete search history.

(56) References Cited

U.S. PATENT DOCUMENTS

| 4,861,750 A | 8/1989 | Nogawa et al. |
| 5,451,548 A | 9/1995 | Hunt et al. |
| 5,550,089 A | 8/1996 | Dutta et al. |
| 5,597,768 A | 1/1997 | Passlack et al. |

(Continued)

FOREIGN PATENT DOCUMENTS

EP   0 987 746 B1   7/2002

OTHER PUBLICATIONS

Passlack, M. et al.; "$Ga_2O_3$ films for electronic and optoelectronic applications"; Journal of Applied Physics; Jan. 15, 1995; pp. 686-693; American Institute of Physics.

(Continued)

*Primary Examiner*—Quoc D Hoang
(74) *Attorney, Agent, or Firm*—Michael J. Balconi-Lamica

(57) ABSTRACT

A method of forming a dielectric layer structure on a supporting semiconductor structure having a first surface comprises providing a first beam of oxide; depositing a first layer of oxide on the first surface of the supporting semiconductor structure using the first beam of oxide, wherein the first layer of oxide has a second surface; terminating the first beam of oxide, and concurrently providing a second beam of oxide, a beam of metal and a beam of oxygen, wherein the first and second beams of oxide are separate and distinct beams of oxide; and depositing a second layer of oxide on the second surface simultaneously using the second beam of oxide, the beam of metal, and the beam of oxygen.

22 Claims, 4 Drawing Sheets

U.S. PATENT DOCUMENTS

| | | | |
|---|---|---|---|
| 5,665,658 | A | 9/1997 | Passlack |
| 5,821,171 | A | 10/1998 | Hong et al. |
| 5,902,130 | A | 5/1999 | Passlack et al. |
| 5,903,037 | A | 5/1999 | Cho et al. |
| 5,962,883 | A | 10/1999 | Hong et al. |
| 6,159,834 | A | 12/2000 | Yu et al. |
| 6,271,069 | B1 | 8/2001 | Chen et al. |
| 6,469,357 | B1 | 10/2002 | Hong et al. |
| 6,914,012 | B2 * | 7/2005 | Passlack et al. ............ 438/763 |

OTHER PUBLICATIONS

Al-Kuhaili, M. F. et al.; "Optical properties of gallium oxide films deposited by electron-beam evaporation"; Applied Physics Letters; Dec. 1, 2003; pp. 4533-4535; vol. 83, No. 22; American Institute of Physics.

Passlack, M. et al.; "Interface charge and nonradiative carrier recombination in $Ga_2O_3$-GaAs interface structures"; Journal of Vacuum Science Technology B; Jan./Feb. 1999; pp. 49-52; American Vacuum Society.

* cited by examiner

METHOD OF FORMING AN OXIDE LAYER ON A COMPOUND SEMICONDUCTOR STRUCTURE

CROSS-REFERENCE TO CO-PENDING APPLICATIONS

This application is a continuation-in-part of patent application Ser. No. 11/136,845, entitled "Article Comprising an Oxide Layer on a GaAs-Based Semiconductor Structure and Method of Forming Same," filed May 25, 2005,now U.S. Pat. No. 7,276,456 which is a continuation of U.S. Ser. No. 10/879,440, entitled "Article Comprising an Oxide Layer on a GaAs-Based Semiconductor Structure and Method of Forming Same," filed Jun. 29, 2004 now U.S. Pat. No. 6,914,012 B2, which is a continuation of U.S. Ser. No. 10/051,494, entitled "Method of Forming Article Comprising an Oxide Layer on a GaAs-Based Semiconductor Structure," filed Jan. 18, 2002 now U.S. Pat. No. 6,756,320 B2.

BACKGROUND

The present invention relates generally to articles that include dielectric oxide layers formed on a GaAs-based semiconductor structure.

In the semiconductor art it is often desirable to form dielectric layers or films on various supporting structures, such as the gate insulator in field effect transistors, an insulator or passivation layer covering various areas (e.g. the extrinsic base region) of other types of transistors, such as HBTs and the like, an insulator or passivation layer surrounding the mesa or walls of a vertical cavity surface emitting laser or edge emitting lasers, etc. Regardless of the use, it is generally imperative that the dielectric layer or film be a good insulator with low defect density to enable device operation and enhance/maintain device performance. Also, the thickness of the layer must be sufficient to provide the required characteristics of the semiconductor devices, e.g. leakage current, reliability, etc.

Due to a lack of insulating layers having low interface state density and stable device operation on gallium arsenide (GaAs) based semiconductors, the performance, integration level and marketability of both digital and analog GaAs based devices and circuits is significantly limited. As is known in the art, growing oxide films by oxidizing GaAs based materials results in high interface state density and a Fermi level which is pinned at the GaAs-oxide interface.

A method of forming a thin film of $Ga_2O_3$ is disclosed, for example, in M. Passlack et al., Journal of Vacuum Science & Technology, vol. 17, 49 (1999), and U.S. Pat. Nos. 6,030,453 and 6,094,295. As discussed in these references, a high quality $Ga_2O_3$/GaAs interface is fabricated using in situ deposition of gallium oxide molecules on GaAs based epitaxial layers while maintaining an ultra-high vacuum (UHV). The thus fabricated $Ga_2O_3$-GaAs interfaces have interface recombination velocities S of 5,000-30,000 cm/s and interface state densities $D_{it}$ as low as $3.5 \times 10^{10}$ $cm^{-2}$ $eV^{-1}$. However, the properties of gallium oxides fabricated by this technique are inadequate for many applications because of high oxide bulk trap densities and excessive leakage current. Consequently, the performance of unipolar and bipolar devices is affected and the fabrication of stable and reliable metal-oxide-semiconductor field effect transistors (MOSFET) based on compound semiconductors has been problematic.

As discussed in U.S. Pat. No. 6,159,834, it has been determined that the aforementioned technique does not produce a high quality $Ga_2O_3$ layer because of oxygen vacancies in the layer that give rise to defects that cause unacceptable oxide trap densities. The '834 patent overcomes this problem by directing a molecular beam of gallium oxide onto the surface of the wafer structure to initiate the oxide deposition, and a second beam of atomic oxygen is supplied upon completion of the first 1-2 monolayers of $Ga_2O_3$. The molecular beam of gallium oxide is provided by thermal evaporation from a crystalline $Ga_2O_3$ or gallate source, and the atomic beam of oxygen is provided by any one of RF or microwave plasma discharge, thermal dissociation, or a neutral electron stimulated desorption atom source. This fabrication technique increases the quality of the $Ga_2O_3$ layer by reducing the density of oxygen related oxide defects while maintaining the excellent quality of the $Ga_2O_3$-GaAs interface. However, oxide bulk trap densities are still unacceptably high and significant leakage current is observed.

As an alternative to $Ga_2O_3$, gadolinium gallium oxides $(Ga_2O_3(Gd_2O_3))$ have been employed as a dielectric layer on GaAs-based devices. While this oxide layer has an acceptably low leakage current density, $Ga_2O_3(Gd_2O_3)$-GaAs interface state densities are relatively high, resulting in unacceptable device performance.

Prior methods also suffer from problems of excessive thermal budget and undesirable lengthy cycle times for depositing a gate oxide stack on a GaAs based semiconductor structure.

Accordingly, it would be desirable to provide a dielectric layer structure on GaAs-based devices that has both a low defect density oxide-GaAs interface and a low oxide leakage current density. Furthermore, there is a need for an improved method and article for overcoming the problems in the art.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in

DETAILED DESCRIPTION

The present inventors have surprisingly determined that a high quality, low defect dielectric layer structure can be formed from a gallium-oxide/GaAs interface followed by a Ga—Gd oxide layer. In contrast, prior art dielectric layers have been composed of either a gallium-oxide/GaAs interface or a Ga—Gd oxide/GaAs interface.

Figure 1:
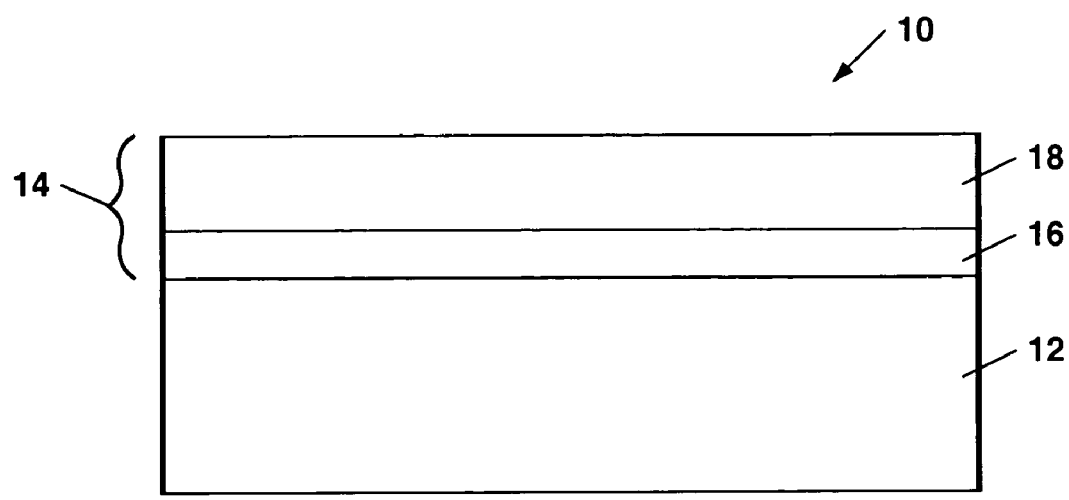
FIG. 1 is a simplified cross-sectional view of a partial semiconductor structure including a composite dielectric layer structure deposited thereon using a method according to one embodiment of the present disclosure.

FIG. 1 is a simplified cross-sectional view of a partial semiconductor structure 10 including a composite dielectric layer structure 14 deposited thereon using a method according to one embodiment of the present disclosure. The partial semiconductor structure 10 includes a compound semiconductor substrate 12, illustrated for simplicity as a single layer. Compound semiconductor substrate 12 can comprise any semiconductor substrate, epilayers, heterostructures or combinations thereof having a surface to be coated with the dielectric layer structure. In one embodiment, the substrate 12 comprises GaAs or a GaAs based material (III-V material) and the epilayers comprise GaAs based material epitaxially grown on the substrate using any suitable process.

The composite dielectric structure 14 includes a first layer 16 formed on the surface of supporting semiconductor structure 12 and a second layer 18 formed on layer 16. As will be explained presently, layer 16 is formed by depositing a layer of $Ga_2O_3$ on the surface of supporting semiconductor structure 12. Layer 16 provides a low interface state density on the GaAs-based supporting semiconductor structure 12. A second layer of material (layer 18) with low bulk trap density relative to the $Ga_2O_3$ is then deposited on the layer 16 to form the composite dielectric structure 14.

The composite dielectric structure 14 may be formed at any convenient time during the fabrication process and may, for example, be formed in situ in a growth chamber after the epitaxial growth of any or all layers included in structure 12.

As discussed in co-pending application Ser. No. 11/136, 845, the $Ga_2O_3$ layer 16 could be formed by any of a variety of techniques that are available to those of ordinary skill in the art. For example, the $Ga_2O_3$ layer could be formed by thermal evaporation of crystalline $Ga_2O_3$ or gallate under UHV conditions. Alternatively, the $Ga_2O_3$ layer could be formed by other suitable techniques known in the art such as by providing a high purity single crystal source of a specifically chosen material and evaporating the source by one of thermal evaporation, electron beam evaporation, and laser ablation. However, as will be discussed further herein, it has been discovered that forming the $Ga_2O_3$ layer 16 with an e-beam source, and then forming the GdGaO layer 18 with two effusion sources, advantageously provides for a reduction of thermal budget and cycle time for depositing a gate oxide ($Ga_2O_3$/GdGaO) stack on GaAs, according to the method as discussed herein and as differentiated from prior methods.

As discussed herein above, when a dielectric layer consisting only of $Ga_2O_3$ is formed on a GaAs-based material, the oxide bulk trap density is unacceptably high. According to one embodiment of the present disclosure, to overcome this problem, the $Ga_2O_3$ layer 16 is only sufficiently thick to substantially cover the GaAs surface and to prevent Gd from the subsequently formed layer 18 from diffusing to the GaAs—$Ga_2O_3$ interface. In particular, the minimum thickness of layer 16 can be determined by the thermodynamic stability requirements of the entire structure. The allowable maximum thickness of layer 16 can also be determined by the bulk trap distribution and density, as well as, semiconductor device performance requirements. For example, in some embodiments, the $Ga_2O_3$ layer 16 is formed with a thickness generally in the range of 0.5 nm to 10 nm, and more preferably, in the range of 2-5 nm.

Subsequent to the formation of $Ga_2O_3$ layer 16, layer 18 is deposited onto $Ga_2O_3$ layer 16 to complete the composite dielectric structure 14. Layer 16 is formed of a material with low bulk trap density relative to $Ga_2O_3$. In particular, in accordance with one embodiment of the present disclosure, layer 18 comprises a Ga—Gd-oxide, which is a mixed oxide that contains Ga, Gd, and oxygen. In one embodiment, the Ga—Gd-oxide comprises $(Gd_{0.65}Ga_{0.35})_2O_3$. While not a limitation on the method of the present disclosure, it is believed that Gd is a stabilizer element for stabilizing Ga in the 3+ oxidation state. It should be understood that the requirement that Ga ions, in mixed oxide films, are substantially fully oxidized does not mean that 100% of all the Ga ions have to be in the 3+ ionization state. For instance, acceptable results may be obtained if 80% or more of all Ga is in the 3+ state. The minimum thickness of layer 18 is determined by semiconductor device performance requirements. For example, in some embodiments, the thickness of layer 18 is in a range of approximately 2 nm to 1000 nm, and more preferably, in the range of 5-20 nm.

According to one embodiment of the present disclosure, the method advantageously enables fabrication of a dielectric layer structure having both a low defect density at the oxide-GaAs interface and a low oxide leakage current density. This result is obtained by depositing the Ga—Gd-oxide on the $Ga_2O_3$ layer 16, which is first used to form a high quality interface with the GaAs-based supporting semiconductor structure. In other words, the method according to the embodiments of the present disclosure employs a composite dielectric structure formed from a layer of $Ga_2O_3$ followed by a layer of Ga—Gd-oxide.

Figure 2:
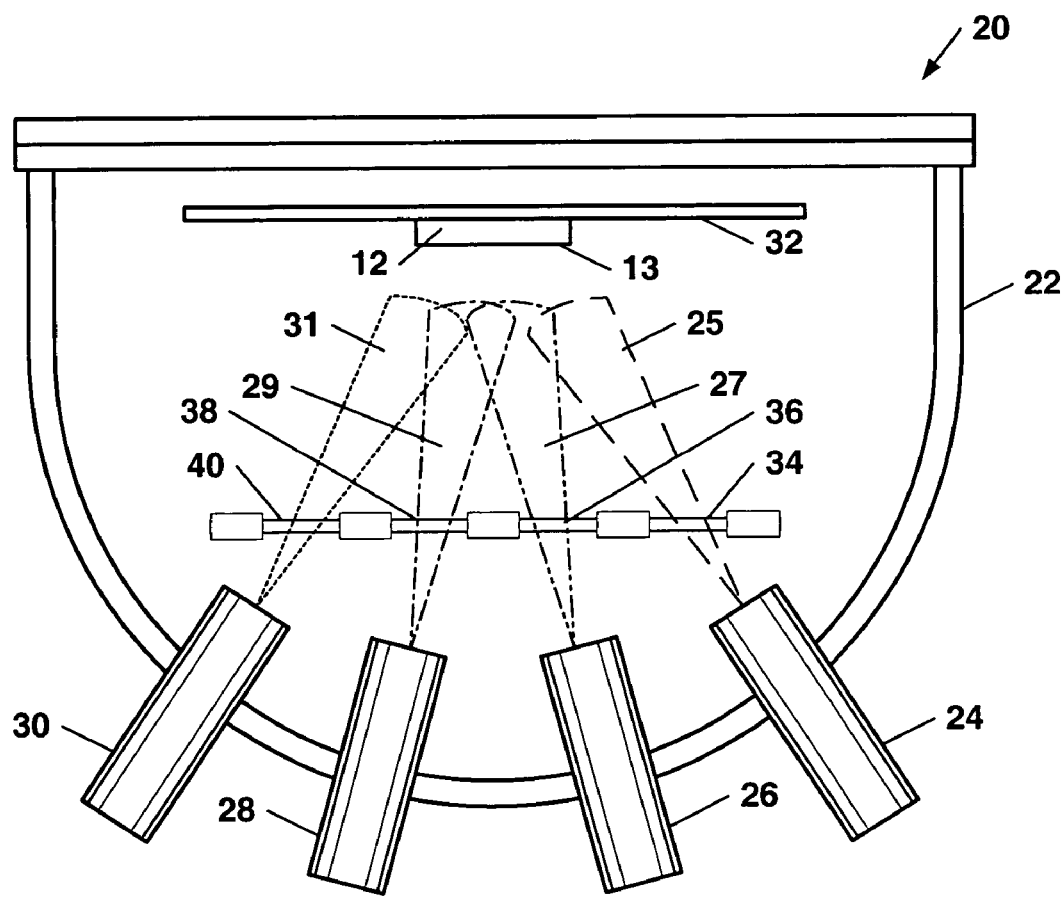
FIG. 2 is a schematic representation of an ultra high vacuum (UHV) molecular beam epitaxy system utilized in fabricating the partial semiconductor structure according to one embodiment of the present disclosure.

FIG. 2 is a schematic representation of an ultra high vacuum (UHV) molecular beam epitaxy system 20 utilized in fabricating the partial semiconductor structure 10 of FIG. 1 according to one embodiment of the present disclosure. System 20 includes a UHV chamber 22, high temperature effusion cells 24 and 28, a source 26 for oxygen, and a template layer cell 30. Template layer cell 30 comprises one of an effusion cell or an e-beam cell, as will be discussed further herein. System 20 further includes cell shutters 34, 36, 38 and 40, and a substrate holder 32 such as a platen. Opening of respective ones of cell shutters 34, 36, 38 and 40, in conjunction with an activation of corresponding cells 24, 26, 28, or 30, results in the creation of a corresponding beam 25, 27, 29, and 31, respectively. It will of course be understood that system 20 may allow the manufacture of a multiplicity of wafers simultaneously and/or includes other standard sources which are routinely used in MBE but which are not shown in FIG. 2, for instance effusion cells for Ga, As, Al, In, Ge, etc.

According to one embodiment, a first cell provides a first beam of gallium oxide for forming a $Ga_2O_3$ template layer and a second cell that comprises an effusion cell provides a second beam of gallium oxide used, in part with another cell and a beam of oxygen, for forming a GdGaO layer. The first cell is referred to herein as a template layer cell. In addition, the second cell is separate and distinct from the first cell. Moreover, using an e-beam cell to provide the first beam of gallium oxide provides certain advantages such as higher throughput, lower maximum temperature for effusion cell operation, etc., as discussed further herein.

In one embodiment, $(Gd_{0.65}Ga_{0.35})_2O_3$ is employed as the Ga—Gd-oxide for the second layer 18 of the composite dielectric structure 14 and the supporting semiconductor structure 12 comprises a GaAs-based supporting semiconductor substrate. In such an instance, the method comprises mounting the GaAs-based supporting semiconductor structure 12 with an atomically ordered and chemically clean upper surface 13 onto substrate holder 32 and loading the same into UHV chamber 22. Subsequently, semiconductor structure 12 is heated to an appropriate elevated temperature in accordance with principles that are well-known to those of ordinary skill in the art.

In one embodiment, template layer cell 30 comprises a high temperature effusion cell. With this embodiment, a crystalline $Ga_2O_3$ or gallate source is thermally evaporated using the high temperature effusion cell. The deposition of $Ga_2O_3$ molecules on the atomically ordered and chemically clean upper surface 13 of semiconductor structure 12 is initiated by opening the cell shutter 40 and providing a molecular beam of gallium oxide 31 directed onto upper surface 13, thus forming the initial gallium oxide layer on the substrate 12.

The quality of the initial gallium oxide layer may be enhanced by depositing atomic oxygen along with the gallium oxide to reduce oxygen vacancies that can give rise to defects. In particular, subsequent to the opening of cell shutter 40, a beam of atomic oxygen 27 is directed onto upper surface 13 of semiconductor structure 12 by opening the shutter 36 of atomic oxygen source 26. The shutter may be opened at any time during the initial $Ga_2O_3$ deposition, preferentially after 1-2 monolayers of $Ga_2O_3$ have been deposited since surface oxidation of GaAs needs to be completely eliminated for low interface state density of the $Ga_2O_3$-GaAs interface.

Next, the Ga—Gd-oxide layer is formed by concurrently depositing $Ga_2O_3$ with Gd. In particular, a $Ga_2O_3$ source material (such as crystalline $Ga_2O_3$), preferably in a high purity form, is thermally evaporated using high temperature effusion cell 28. A Gd source material (such as Gd metal), preferably in a high purity form, is thermally evaporated using high temperature effusion cell 24. The deposition of the $Ga_2O_3$ and Gd is initiated by opening cell shutters 38 and 34, respectively, at a time subsequent to termination of the $Ga_2O_3$ deposition by template layer cell 30. However, Gd deposition may begin before or subsequent to exposing semiconductor structure 12 to the beam of atomic oxygen. Those of ordinary skill in the art will recognize that the properties of the composite dielectric structure 14 formed on semiconductor structure 12 such as its stoichiometry can be controlled by adjusting the flux from the $Ga_2O_3$ effusion cell 28, the Gd effusion cell 24, and the atomic oxygen cell 26.

Figure 3:
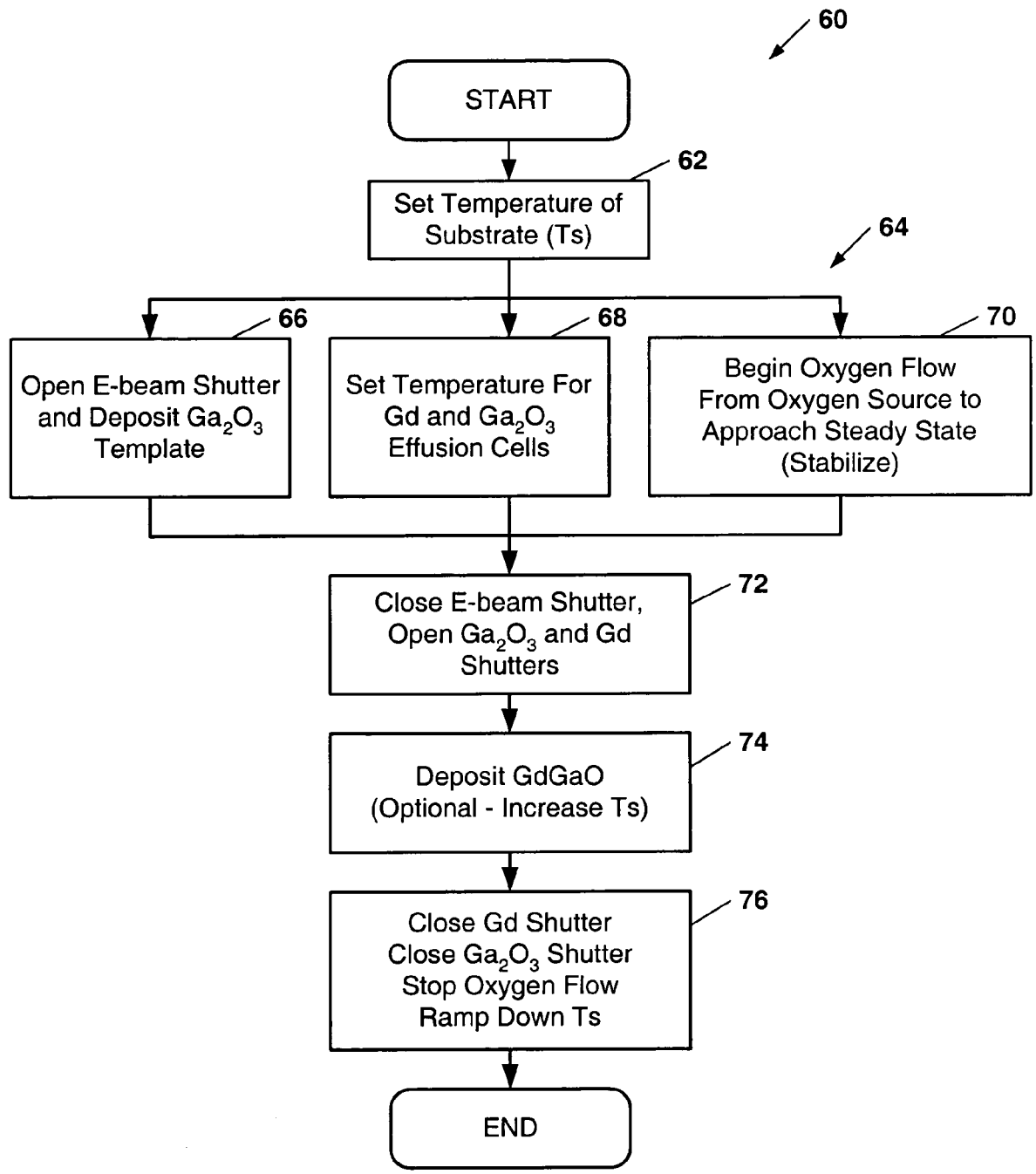
FIG. 3 is a flow chart view of a method for depositing a composite dielectric layer on a semiconductor structure according to one embodiment of the present disclosure.

FIG. 3 is a flow chart view 60 of a method for depositing a composite dielectric layer 14 on a semiconductor structure 12 according to one embodiment of the present disclosure. In the illustrative example that follows, template layer cell 30 comprises an e-beam cell. With reference now to FIGS. 2 and 3, subsequent to placement of the semiconductor substrate 12 onto substrate platen 32 and within chamber 22, further subsequent to any other appropriate initial preparations for operation of system 20, the method begins at step 62. At step 62, the method includes setting the temperature of the substrate to a desired substrate temperature (Ts). In a next step, generally indicated by reference numeral 64, the method includes several concurrent steps 66, 68, and 70. In step 66, the e-beam shutter 40 in front of e-beam cell 30 is opened and a beam 31 of $Ga_2O_3$ forms an initial template layer 16 on the surface 13 of substrate 12. Concurrent with the deposition of the template layer 16, in step 68, a temperature is established or set for the $Ga_2O_3$ and Gd high temperature effusion cells 28 and 24, respectively. In addition, in step 70, concurrently with steps 66 and 68, oxygen from oxygen source 26 is allowed to flow by opening shutter 36, thus enabling the formation of a beam of oxygen 27, to approach a steady state condition and stabilize.

In a next step 72, the e-beam shutter 40 is closed and the shutters 38 and 34 for the high temperature effusion cells 28 and 24, respectively, are opened. Closing of e-beam shutter 40 terminates a deposition of the initial $Ga_2O_3$ template layer from the $Ga_2O_3$ source e-beam cell 30. Opening of the shutters 38 and 34 for the $Ga_2O_3$ and Gd high temperature effusion cells 28 and 24, respectively, results in the beginning deposition of the GdGaO layer 18 of the composite dielectric stack 14. In step 74, deposition of the GdGaO layer 18 of the composite dielectric stack 14 continues to a desired thickness. An optional feature of step 74 comprises increasing the substrate temperature (Ts) by a prescribed amount. Increasing of the substrate temperature at this point in the method provides improved morphology of the GdGaO layer 18. In step 76, the method includes closing the Gd shutter 34, closing the $Ga_2O_3$ shutter 38, and stopping the oxygen flow by closing the oxygen cell shutter 36. In addition, the substrate temperature (Ts) is ramped down to a desired temperature level. Subsequent to step 76, the process ends, or alternatively proceeds onto additional processing, according to the particulars of a given semiconductor device manufacturing process.

The methods according to the embodiments of the present disclosure provide for a reduction of thermal budget and cycle time for depositing a gate oxide ($Ga_2O_3$/GdGaO) stack on GaAs, in comparison to prior methods. For example, in U.S. Pat. No. 6,756,320, the disclosed method suggests the deposition of a gate oxide stack using two effusion sources of $Ga_2O_3$ and Gd. However, by using the effusion sources alone in combination with an oxygen source, the thermal budget of the process is high since the vapor pressure of the constituent elements are low.

In the prior approach of depositing $Ga_2O_3$ and Gd using polycrystalline $Ga_2O_3$ and elemental Gd in high temperature effusion cells, the $Ga_2O_3$ effusion cell needs to be operated at very high temperatures during the deposition of the $Ga_2O_3$ layer. For example, the $Ga_2O_3$ cell operates at a very high temperature on the order of approximately 1900 degrees Celsius. Such high temperatures places stringent requirements on the materials used in the cell design. Also, such high temperatures reduce the lifetime of the cell and cause a large thermal load in the MBE system. While it is possible to operate the cell at lower temperature, the flux will also be reduced, thereby resulting in an increase in the time for the deposition of the oxide layer. This becomes even more of an issue in larger production systems, which have a larger source-substrate, since flux is inversely proportional to the square of the source-substrate distance.

Furthermore, in the prior approach, the process utilized two sources as described above. The $Ga_2O_3$ layer is first deposited using the effusion cell at 1990° C. to obtain a non-zero deposition rate. Following the initial $Ga_2O_3$ layer, the $Ga_2O_3$ effusion cell is ramped to a lower temperature (i.e., typically around 1700° C.) for the deposition of GdGaO with the Gd effusion cell typically operating at 1500° C. Ramping of the $Ga_2O_3$ effusion cell to lower temperature results in an undesirable gradient in Ga concentration in GdGaO layer, as will be discussed further herein with reference to FIG. 4.

In order to overcome the limitations of the prior approach, the method according to the embodiments of the present disclosure provide an improved process for depositing the $Ga_2O_3$/GdGaO stack. The method utilizes a total of two $Ga_2O_3$ sources. A first $Ga_2O_3$ source is primarily used for depositing the $Ga_2O_3$ template layer and the second $Ga_2O_3$ source is used for depositing the GdGaO ternary layer. In a preferred embodiment, the first $Ga_2O_3$ source comprises an e-beam cell. The use of an e-beam cell for the $Ga_2O_3$ template layer formation thus drastically reduces the overall thermal budget, i.e. the maximum effusion temperature will now be lower by almost 300° C. in the methods of the present disclosure. Furthermore, the time for the $Ga_2O_3$ template layer formation is reduced by an order of magnitude from fifteen to twenty (15-20) minutes (when using an effusion cell) to about one-half to two (0.5-2) minutes when using an e-beam cell. In addition, the method according to the embodiments of the present disclosure utilizes two effusion cells in connection with the GdGaO layer formation, which allows for composition control of the ternary material during deposition.

According to the embodiments of the present disclosure, the method uses multiple $Ga_2O_3$ sources to address the issue of thermal budget and composition control. In addition, the use of an e-beam for forming an initial $Ga_2O_3$ template layer, according to the embodiments disclosed herein, reduces an overall time required to deposit the resultant composite oxide stack.

Figure 4:
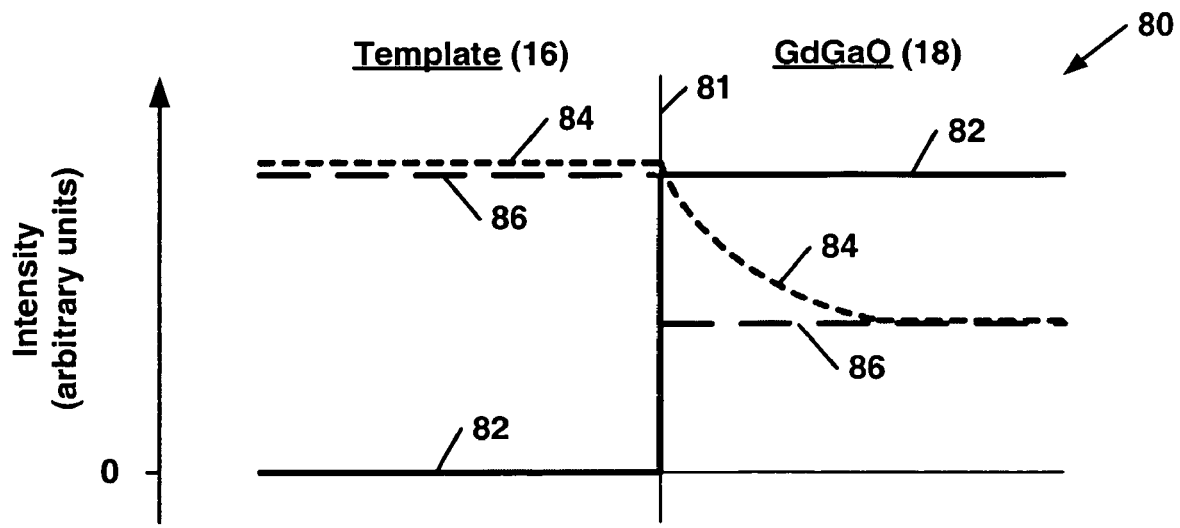
FIG. 4 is graphical representation view of an intensity of constituents within the template layer and the GdGaO layer manufactured using (i) a prior method and (ii) the method according to one embodiment of the present disclosure.

FIG. 4 is graphical representation view 80 of an intensity of constituents within the $Ga_2O_3$ template layer 16 and the GdGaO layer 18 manufactured using (i) a prior method and (ii) the method according to one embodiment of the present disclosure. An interface between the $Ga_2O_3$ template layer 16 and the GdGaO layer 18 is indicated by reference numeral 81. In both (i) the prior method and (ii) the method according to one embodiment of the present disclosure, the intensity of Gd constituents 82 within the template layer (16) comprises essentially zero (0) and at the interface 81, the intensity of Gd constituents increases in a step-wise fashion, to a high level, as indicted by reference numeral 82. For the Ga constituents within the template layer 16 in both (i) the prior method (indicated by reference numeral 84) and (ii) the method according to one embodiment of the present disclosure (indicated by reference numeral 86), the Ga constituents are approximately the same.

However, the Ga constituents within the GdGaO layer 18 in (i) the prior method (indicated by reference numeral 84 on the right-hand side of FIG. 4) and (ii) the method according to one embodiment of the present disclosure (indicated by reference numeral 86 on the right-hand side of FIG. 4) show a difference in the Ga constituents. In other words, there exists a region proximate the interface 81 in which the Ga constituents contained within the GdGaO layer 18 are not the same for both methods.

That is, with the use of the prior method that includes two high temperature effusion cells alone, an undesired distribution of Ga as indicated by reference numeral 84 on the right-hand side of FIG. 4 is produced. Furthermore, using the prior method, the intensity of the Ga constituent slowly decreases, in an exponential like manner, from a high level at the interface 81 to a desired level. Accordingly, the non-abrupt, slowly varying distribution of the Ga constituents proximate the interface 81 within the GdGaO layer 18 is undesirable.

With the embodiments according to the present disclosure, the use of an e-beam cell for the formation of the $Ga_2O_3$ template layer, followed by the termination of usage of the e-beam cell and initiating usage of a $Ga_2O_3$ effusion cell for the formation of the GdGaO layer 18, produces an abrupt step-wise transition from the high Ga constituent intensity to the desired Ga constituent intensity, in contrast to the non-abrupt transition of Ga constituent as indicated by reference numeral 84. Accordingly, an improved interface between the template and GdGaO layers (16 and 18, respectively) of the composite dielectric layer is now made possible.

Figure 5:
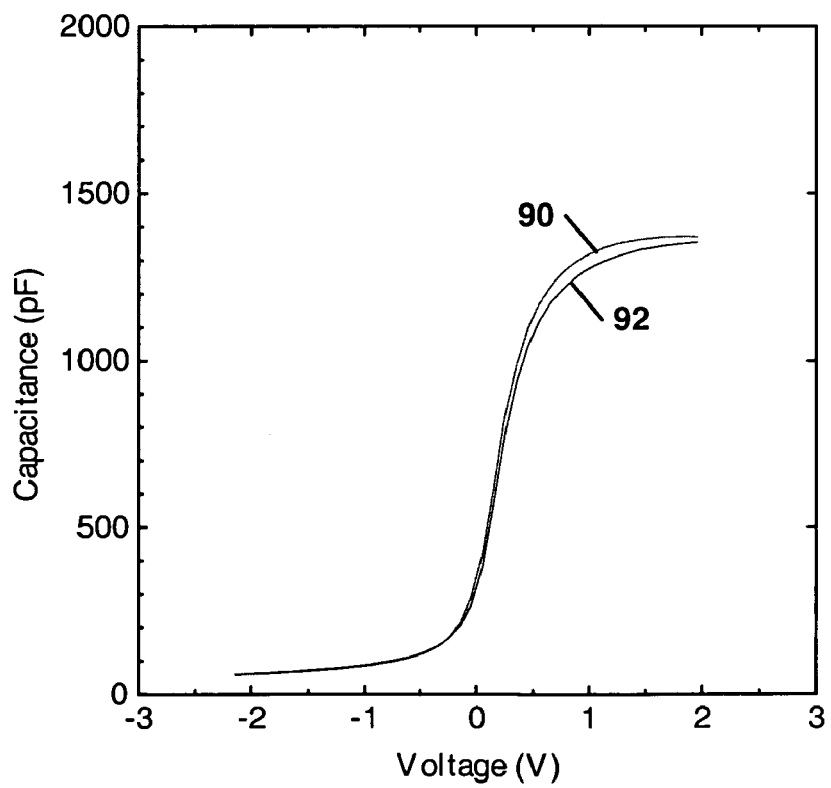
FIG. 5 is a capacitance-voltage (C-V) characteristic graphical representation view of composite dielectric layers grown by the method according to the embodiments of the present disclosure.

FIG. 5 is a capacitance-voltage (C-V) characteristic graphical representation view of composite dielectric layers grown by the method according to the embodiments of the present disclosure. The C-V curve indicated by reference numeral 90 corresponds to a $GdGaO/Ga_2O_3$ dielectric stack on GaAs, in which an e-beam cell was used to deposit the $Ga_2O_3$ template layer 16. The C-V curve indicated by reference numeral 92 corresponds to a $GdGaO/Ga_2O_3$ dielectric stack on GaAs, in which an effusion cell was used to deposit the $Ga_2O_3$ template layer 16. As illustrated in FIG. 5, the composite dielectric layers exhibit electrical C-V characteristics that are comparable. The method according to the embodiments of the present disclosure is also suitable for a number of dielectric materials on semiconductors including silicon.

Figure 6:
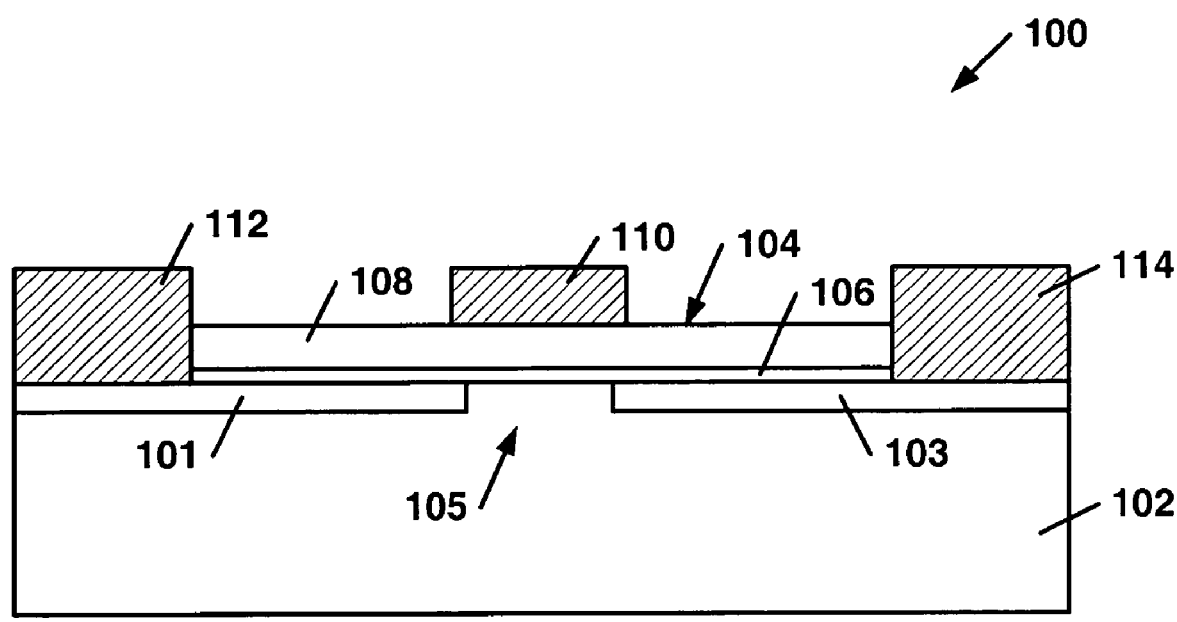
FIG. 6 is a cross-sectional view of a semiconductor device including a gate dielectric that was deposited using the method according to one embodiment of the present disclosure.

FIG. 6 is a cross-sectional view of a semiconductor device including a gate dielectric that was deposited using the method according to one embodiment of the present disclosure. In particular, FIG. 6 illustrates a simplified cross-sectional view of a metal-oxide-semiconductor field effect transistor MOSFET 100 constructed using the method in accordance with one embodiment of the present disclosure. MOSFET 100 includes a substrate 102 having heavily doped source and drain regions 101 and 103, respectively, formed therein with a channel area 105 in-between. In one embodiment, substrate 102 comprises a GaAs based material. A composite dielectric layer structure, generally indicated by reference numeral 104 and also referred to as a gate oxide, is formed over channel area 105 using the method according to the embodiments of the present disclosure. Dielectric layer structure 104 includes a first layer 106 of $Ga_2O_3$ and a second layer 108 of Ga—Gd-oxide. A gate metal contact 110 is formed on dielectric layer structure 104 in a usual procedure and source and drain contacts (112,114) are formed on source and drain regions 101 and 103, respectively. In an alternate embodiment, MOSFET 100 could also comprise an implant-free MOSFET, wherein the implant-free MOSFET is devoid of implanted source and drain regions 101 and 103, respectively.

Other examples of semiconductor devices incorporating a dielectric layer structure formed according to the embodiments of the present disclosure could include a heterojunction bipolar transistor (HBT). In a simplified form, the HBT includes a substrate, a collector layer formed (grown or otherwise deposited) on the upper surface of substrate, a base layer formed on the upper surface of collector layer and an emitter layer formed on the upper surface of base layer. Collector contact or contacts are formed on an upper surface of the collector layer. Base contact or contacts are formed on an upper surface of the base layer. An emitter contact is formed on an upper surface of emitter layer. All of the various layers and contacts are formed in a well known manner and may be formed in any sequence convenient to the specific device and fabrication technique being utilized. In general, the substrate comprises a GaAs-based material and the materials used in the various layers are in a similar material system so as to be crystallographically coupled. This is accomplished, as is known in the art, by epitaxially growing the various layers in sequence in a standard growth chamber.

In connection with the example of the HBT, a composite dielectric layer structure, such as the composite dielectric layer structure 104 described in connection with FIGS. 1-3 can be formed over exposed portions of an emitter layer and base layer for purposes of passivation and to enhance device performance and stability. As explained above, the dielectric layer structure may be formed at any convenient time during the fabrication process following removal of native oxide under ultra-high vacuum conditions. Composite dielectric layer structure includes a first layer and a second layer, similar to a thin layer of $Ga_2O_3$ (16) and a layer of Ga—Gd-oxide (18) of FIG. 1. The first and second layers are formed in accordance with the method according to the embodiments of the present disclosure, typically after the formation of contacts. The composite dielectric layer structure is generally formed with a thickness greater than about 50 angstroms and preferably in a range of approximately 70 angstroms to 250 angstroms.

It should be understood that the semiconductor device depicted in FIG. 6 is presented by way of illustration only and that the method according to the embodiments of the present disclosure is more generally applicable to a composite dielectric structure formed on a wide variety of different semiconductor devices, such as semiconductor lasers and photosensitive devices, for example.

According to one embodiment of the present disclosure, a method of forming a dielectric layer structure on a supporting semiconductor structure having a first surface, the method includes: providing a first beam of oxide; depositing a first layer of oxide on the first surface of the supporting semiconductor structure using the first beam of oxide, wherein the first layer of oxide has a second surface; terminating the first beam of oxide, and concurrently providing a second beam of oxide, a beam of metal and a beam of oxygen, wherein the first and second beams of oxide are separate and distinct beams of oxide; and depositing a second layer of oxide on the second surface simultaneously using the second beam of oxide, the beam of metal, and the beam of oxygen.

In another embodiment, the method further includes: establishing desired cell temperatures for the second beam of oxide and the beam of metal, and initiating the beam of oxygen, all concurrently with depositing the first layer of oxide on the first surface of the supporting semiconductor structure, and wherein concurrently providing the beam of oxygen with the terminating of the first beam of oxide further includes continuing to provide the beam of oxygen, further wherein an oxygen flow of the beam of oxygen comprises a steady state flow.

In yet another embodiment, prior to providing the first beam of oxide, the method further includes heating the supporting semiconductor structure to a first substrate temperature. In a further embodiment, wherein during the depositing of the second layer of oxide, the method further includes: heating the supporting semiconductor structure to a second substrate temperature, the second substrate temperature being greater than a first substrate temperature.

In various additional embodiments, providing the first beam of oxide can comprise providing a beam of gallium oxide via an e-beam cell or providing a beam of gallium oxide via an effusion cell. Providing the second beam of oxide can comprise providing a beam of gallium oxide via an effusion cell. In addition, the second beam of oxide can be provided via an effusion cell, and the beam of metal can be provided via another effusion cell. Furthermore, providing the beam of metal can include providing a beam of Gd. Still further, the beam of oxygen can include (i) a beam of molecular oxygen or (ii) a beam of oxygen provided by a plasma source. The first layer of oxide can comprise gallium oxide. The second layer of oxide can comprise Ga—Gd-oxide, wherein the Ga—Gd-oxide comprises $(Gd_{0.65}Ga_{0.35})_2O_3$.

In one embodiment, the supporting semiconductor structure comprises a compound semiconductor-based supporting structure. In addition, the compound semiconductor-based supporting structure can include a GaAs based semiconductor structure. Furthermore, the compound semiconductor-based supporting structure can also include one or more epitaxial layers.

In another embodiment, a method of forming a dielectric layer structure on a supporting semiconductor structure includes: providing a compound semiconductor-based supporting structure having a first surface; providing a first beam of oxide and providing a beam of oxygen; depositing a first layer of oxide on the first surface simultaneously using the first beam of oxide and the beam of oxygen wherein the first layer of oxide has a second surface; terminating the first beam of oxide, and concurrently providing a second beam of oxide and a beam of metal, while continuing the beam of oxygen, wherein the first and second beams of oxide are separate and distinct beams of oxide; and depositing a second layer of oxide on the second surface simultaneously using the second beam of oxide, the beam of metal, and the beam of oxygen.

According to yet another embodiment of the present disclosure, a method of providing a four beam deposition includes: providing a first cell supplying a first beam of oxide, wherein the first cell comprises one of an effusion cell or an e-beam cell; providing a second cell supplying a second beam of oxide, wherein the second cell is distinct from the first cell and wherein the second cell comprises an effusion cell; providing a third cell supplying a beam of metal; and providing a source supplying a beam of oxygen. Providing the first cell can further include (i) providing an effusion cell with a gallium oxide or gallate source material or (ii) providing an e-beam cell with a gallium oxide source material. Providing the second cell can include providing an effusion cell with a gallium oxide or gallate source material. In addition, providing the third cell can include providing an effusion cell with a Gd source material. Furthermore, providing the source supplying the beam of oxygen can include providing a beam of molecular oxygen or atomic oxygen.

The method according to the embodiments of the present disclosure provides an improved process that could be highly suitable for large scale production, where deposition systems and semiconductor wafers are larger than prior systems and wafers.

In the foregoing specification, the disclosure has been described in reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the methods according to the embodiments of the present disclosure facilitate furthering various developments and improvements for GaAs-based MOSFET devices. The present embodiments can apply to semiconductor device technologies where a $GdGaO/Ga_2O_3$ dielectric stack is used as a gate oxide. The present embodiments can further apply to implant-free MOSFETs.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming a dielectric layer structure on a supporting semiconductor structure having a first surface, the method comprising:
   providing a first beam of oxide;
   depositing a first layer of oxide on the first surface of the supporting semiconductor structure using the first beam of oxide, wherein the first layer of oxide has a second surface;
   terminating the first beam of oxide, and concurrently providing a second beam of oxide, a beam of metal and a beam of oxygen, wherein the first and second beams of oxide are separate and distinct beams of oxide; and
   depositing a second layer of oxide on the second surface simultaneously using the second beam of oxide, the beam of metal, and the beam of oxygen.

2. The method of claim 1, further comprising:
   establishing desired cell temperatures for the second beam of oxide and the beam of metal, and initiating the beam of oxygen, all concurrently with depositing the first layer of oxide on the first surface of the supporting semiconductor structure, and
   wherein concurrently providing the beam of oxygen with the terminating of the first beam of oxide further comprises continuing to provide the beam of oxygen, further wherein an oxygen flow of the beam of oxygen comprises a steady state flow.

3. The method of claim 1, wherein prior to providing the first beam of oxide, the method further comprising:
   heating the supporting semiconductor structure to a first substrate temperature.

4. The method of claim 1, further wherein during the depositing of the second layer of oxide, the method further comprising:
   heating the supporting semiconductor structure to a second substrate temperature, the second substrate temperature being greater than a first substrate temperature.

5. The method of claim 1, wherein providing the first beam of oxide comprises providing a beam of gallium oxide via an e-beam cell.

6. The method of claim 1, wherein providing the first beam of oxide comprises providing a beam of gallium oxide via an effusion cell.

7. The method of claim 1, wherein providing the second beam of oxide comprises providing a beam of gallium oxide via an effusion cell.

8. The method of claim 1, wherein the second beam of oxide is provided via an effusion cell, and wherein the beam of metal is provided via another effusion cell.

9. The method of claim 1, wherein providing the beam of metal includes providing a beam of Gd.

10. The method of claim 1, wherein the beam of oxygen includes (i) a beam of molecular oxygen or (ii) a beam of oxygen provided by a plasma source.

11. The method of claim 1, wherein the first layer of oxide comprises gallium oxide.

12. The method of claim 1, wherein the second layer of oxide comprises Ga—Gd-oxide.

13. The method of claim 12, wherein the Ga—Gd-oxide comprises $(Gd_{0.65}Ga_{0.35})_2O_3$.

14. The method of claim 1, wherein the supporting semiconductor structure comprises a compound semiconductor-based supporting structure.

15. The method of claim 14, wherein the compound semiconductor-based supporting structure comprises a GaAs based semiconductor structure.

16. The method of claim 14, wherein the compound semiconductor-based supporting structure comprises one or more epitaxial layers.

17. The method of claim 1, wherein:
   providing the first beam of oxide includes providing a first cell for supplying the first beam of oxide, wherein the first cell comprises one of an effusion cell or an e-beam cell;
   providing the second beam of oxide includes providing a second cell for supplying the second beam of oxide, wherein the second cell is distinct from the first cell and wherein the second cell comprises an effusion cell;
   providing the beam of metal includes providing a third cell for supplying the beam of metal; and
   providing the beam of oxygen includes providing a source for supplying a beam of oxygen.

18. The method of claim 17, wherein providing the first cell comprises providing an effusion cell with a gallium oxide or gallate source material.

19. The method of claim 17, wherein providing the first cell comprises providing an e-beam cell with a gallium oxide source material.

20. The method of claim 17, wherein providing the second cell comprises providing an effusion cell with a gallium oxide or gallate source material.

21. The method of claim 17, wherein providing the third cell comprises providing an effusion cell with a Gd source material.

22. The method of claim 17, wherein providing the source for supplying the beam of oxygen comprises providing a beam of molecular oxygen or atomic oxygen.

* * * * *

UNITED STATES PATENT AND TRADEMARK OFFICE
CERTIFICATE OF CORRECTION

| | | |
|---|---|---|
| PATENT NO. | : 7,442,654 B2 | Page 1 of 1 |
| APPLICATION NO. | : 11/239749 | |
| DATED | : October 28, 2008 | |
| INVENTOR(S) | : Droopad et al. | |

It is certified that error appears in the above-identified patent and that said Letters Patent is hereby corrected as shown below:

Column 1, line 5, delete "CO-PENDING" and insert -- RELATED --.

Column 1, line 11, delete "2005,now" and insert -- 2005, now --.

Signed and Sealed this

Twenty-third Day of November, 2010

David J. Kappos
*Director of the United States Patent and Trademark Office*